US012799042B2

(12) United States Patent
Fabregat Santiago et al.

(10) Patent No.: US 12,799,042 B2
(45) Date of Patent: Nov. 17, 2026

(54) CERAMIC SWITCH TILE AND MANUFACTURING METHOD

(71) Applicant: UNIVERSITAT JAUME I, Castellón de la Plana (ES)

(72) Inventors: Francisco Fabregat Santiago, Castellón de la Plana (ES); Sergio Mestre Beltrán, Castellón de la Plana (ES); Maria Dolores Palacios Tejero, Castellón de la Plana (ES)

(73) Assignee: UNIVERSITAT JAUME I, Castellón de la Plana (ES)

( * ) Notice: Subject to any disclaimer, the term of this patent is extended or adjusted under 35 U.S.C. 154(b) by 743 days.

(21) Appl. No.: 18/035,118

(22) PCT Filed: Dec. 16, 2021

(86) PCT No.: PCT/ES2021/070901
§ 371 (c)(1),
(2) Date: May 3, 2023

(87) PCT Pub. No.: WO2022/129669
PCT Pub. Date: Jun. 23, 2022

(65) Prior Publication Data

US 2024/0025814 A1 Jan. 25, 2024

(30) Foreign Application Priority Data

Dec. 17, 2020 (ES) ............................... ES202031264

(51) Int. Cl.
*C04B 41/87* (2006.01)
*C04B 35/457* (2006.01)
(Continued)

(52) U.S. Cl.
CPC ............ *C04B 41/87* (2013.01); *C04B 35/457* (2013.01); *C04B 35/64* (2013.01); *C04B 41/86* (2013.01);
(Continued)

(58) Field of Classification Search
None
See application file for complete search history.

(56) References Cited

U.S. PATENT DOCUMENTS

2010/0126564 A1* 5/2010 Salomoni ................ H02S 20/25
257/E31.037
2017/0031480 A1 2/2017 Gabriel et al.
(Continued)

FOREIGN PATENT DOCUMENTS

CN 101740240 A 6/2010
CN 202977213 U 6/2013
(Continued)

OTHER PUBLICATIONS

Ceramics, from https://www.chemistryexplained.com/Bo-Ce/Ceramics.html#google_vignette (Year: 2019).*

*Primary Examiner* — David Sample
(74) *Attorney, Agent, or Firm* — Hayes Soloway PC

(57) ABSTRACT

A ceramic switch tile has the function of a capacitive switch or pushbutton that can be used in pushbuttons, keyboards or other applications, and is made entirely of ceramic materials forming a single block. Specifically, the tile has a non-conductive ceramic support. The tile also includes areas with a conductive ceramic layer, deposited making contact with one side of the non-conductive ceramic support and separated from each other. Each area with a conductive ceramic layer has a connection sector, intended to be connected to a capacitance variation measurement module, configured to control electrical devices to be switched. The tile also has a protective glazing layer, which covers the areas with the
(Continued)

conductive ceramic layer and the rest of the non-conductive ceramic support on the same side, except for the connection sectors.

10 Claims, 5 Drawing Sheets

(51) Int. Cl.

| | |
|---|---|
| ***C04B 35/64*** | (2006.01) |
| ***C04B 41/86*** | (2006.01) |
| ***C04B 41/89*** | (2006.01) |
| ***H03K 17/96*** | (2006.01) |

(52) U.S. Cl.
CPC ........... *C04B 41/89* (2013.01); *H03K 17/962* (2013.01); *C04B 2235/3293* (2013.01); *C04B 2235/3294* (2013.01); *C04B 2235/349* (2013.01)

(56) References Cited

U.S. PATENT DOCUMENTS

| | | | | |
|---|---|---|---|---|
| 2019/0382302 | A1* | 12/2019 | Xue | ........................ C03C 3/089 |
| 2020/0184303 | A1 | 6/2020 | Herslow et al. | |

FOREIGN PATENT DOCUMENTS

| | | | | | |
|---|---|---|---|---|---|
| CN | 104197077 | A | | 12/2014 | |
| CN | 102550136 | B | | 4/2015 | |
| CN | 104518772 | A | | 4/2015 | |
| CN | 105732015 | A | | 7/2016 | |
| CN | 210778286 | U | | 6/2020 | |
| DE | 202011003166 | U1 | | 9/2011 | |
| EP | 0343685 | A2 | | 5/1989 | |
| EP | 0133917 | B1 | | 10/1991 | |
| GB | 1213621 | A | | 11/1970 | |
| GB | 2060895 | A | * | 5/1981 | ............... H05B 1/00 |
| JP | H07272604 | A | | 10/1995 | |
| JP | 2006313763 | A | | 11/2006 | |
| WO | 03028185 | A1 | | 4/2003 | |

* cited by examiner

CERAMIC SWITCH TILE AND MANUFACTURING METHOD

CROSS-REFERENCE TO RELATED APPLICATIONS AND PRIORITY

This patent application claims priority from PCT Application No. PCT/ES2021/070901 filed Dec. 16, 2021, which claims priority from Spanish Patent Application No. P202031264 filed Dec. 17, 2020.

OBJECT OF THE INVENTION

The object of the invention is a ceramic tile that works as a capacitive switch or pushbutton, and a manufacturing method thereof, which belongs to the ceramic and electrical field, and has its applications as a pushbutton/switch for devices, keyboards and/or lighting.

BACKGROUND OF THE INVENTION

Electrical switches and pushbuttons for lighting or for activating devices have the problem of progressive deterioration, either due to wear of the mechanical elements, typical of lighting switches, or rupture of the membranes that protect same, which leads to the end of its useful life, either due to functional or aesthetic failure.

If these switches or pushbuttons are located outdoors, in dirty or chemically aggressive environments, this degradation is accelerated, which requires the use of much more expensive materials which, however, need to be replaced from time to time to ensure their correct functioning.

In addition, in the event of an accident that causes a rise in temperature above a certain limit, some of its elements melt/degrade, rendering them useless.

Moreover, when the environment is very humid or the environment contains gases or vapours of an explosive nature, conventional switches and pushbuttons may present safety problems.

The aforementioned problems are mainly due to the fact that currently the manufacture of electrical switches for domestic use is mainly based on a series of parts made of polymer material (usually those which correspond to the pushbutton, and to the connection to the wall) and one or more movable metal parts that open or close the electrical circuit under the action of the pushbutton.

An alternative to the above are capacitive switches, which can open or close the electrical circuit without movable parts, and which have found applications in units such as elevators, ceramic hobs, and other devices.

In the past, many electrical switches were partially made of porcelain, although they have gradually been replaced by polymer materials. However, the advantages of ceramic materials are evident for this type of application and for this reason several applications of same in electrical switches have been disclosed.

Document EP0343685A2 discloses the application of switches without movable parts based on piezoelectric ceramics combined with polymer materials. The pressure exerted on the piezoelectric material generates an electrical signal, which is used to switch a circuit, which in this document corresponds to a keyboard.

More frequent are documents that disclose improved switches that incorporate some type of ceramic component in the construction thereof, in addition to other materials, usually polymer materials, as well as metal contacts.

Document DE202011003166U1 relates to a capacitive touch pushbutton. The capacitive sensor is arranged under a rigid plate, which may be ceramic. A contact surface that can be ceramic rises above this rigid layer. Informative symbols can be incorporated between the lower portion of the contact body and the upper portion of the rigid plate. This document mentions two portions with separate functionalities: on the one hand, the support and protection plate (which can be made of one or several layers of different materials) and a capacitive sensor made up of metal conductors.

Document JPH07272604A discloses an indoor switch formed by a ceramic plate and a touch sensor arranged under this ceramic plate. On the surface of the ceramic plate there is a touch region, made of a conductive material, which is connected to the touch sensor by means of a circuit. The document also indicates that different ceramic tiles can be combined to form a decorative pattern or drawing, such that one of the tiles acts as a pushbutton.

The detail of the document indicates that the touch region is made up of a noble metal mixed with an inorganic adhesive, which then undergoes a heat treatment to attach it on the ceramic. A track made of the same material joins the touch region with the sensor located on the rear portion of the ceramic plate.

Document US2020184303A1 discloses a card, made up of a monolithic ceramic body, which can function as a data card, credit card, gift card, smart card and other similar cards. To do this, the card must incorporate electrical or magnetic devices with electrical contacts or antennas capable of performing the required functions, whether having contact or contactless. The ceramic body can reflect the desired information or fulfil an aesthetic function.

Likewise, the document details a method for making the ceramic body that includes tin oxide, antimony oxide and the use of nanoparticles. The presence of ceramic material in this document is to give the card an improved aesthetic nature and greater durability than polymer ones. Moreover, bank card characteristics (such as chips, antennas for contactless payments, etc.) are achieved by adhering said components to the ceramic or to the core of the card in grooves or recesses prepared for that purpose, but they are not formed by ceramic material.

Moreover, the advantages of a switch that can be integrated into the wall decoration is an old idea, and some documents have already mentioned this concept such as CN101740240A, which discloses a hand-decorated ceramic panel to be able to integrate the switch into the decoration.

Finally, capacitive ceramic switches have been disclosed, such as document CN104518772A, which uses a ceramic piece to cover a standard capacitive sensor, or document CN104197077A, which incorporates a standard capacitive sensor in a sink to control the flow of water from a tap.

However, in the state of the art, capacitive ceramic switches and pushbuttons, made entirely of ceramic materials and forming a single block, to which the electrodes of the corresponding control circuit are connected, have not been disclosed.

DESCRIPTION OF THE INVENTION

The object of the present invention is a capacitive switch, without movable parts and made up solely of ceramic components, which can be placed as another tile on walls or floors, or as part of an independent ceramic keyboard.

The absence of movable components and the ceramic nature of its components ensures high durability, easy cleaning and high resistance to chemical corrosion and fire. In addition, it can benefit from all the decorative possibilities of today's ceramic technology.

Compared to the devices of the state of the art, the switch tile object of the present invention is made up of a mostly clayey support, such as a ceramic tile, on which a ceramic material layer with the appropriate properties is deposited in certain areas and all covered by a protective glazing, which can be decorated.

Moreover, the contact surface of the tile is not a separate part, but rather the same surface of the protective glazing. With this invention, a much more compact and simple product is obtained than in the indicated references.

Specifically, the ceramic switch tile comprises, firstly, a non-conductive ceramic support, preferably a ceramic tile obtained from natural clay, which confers mechanical resistance to the assembly. The non-conductive ceramic support can be obtained from inorganic raw materials, either natural, synthetic or a mixture of both.

Making contact with the ceramic support, a conductive ceramic layer is deposited in certain areas, preferably made up of antimony-doped tin oxide, together with sintering additives that make it possible to obtain electrical continuity after a sintering treatment.

The conductive ceramic layer deposited on the non-conductive ceramic support can form a single area (single electrode) or several areas separated from each other and without electrical contact between them (independent electrodes). In the latter case, the areas with a conductive ceramic layer are distributed forming the electrodes of one or multiple capacitors, depending on their application in a single or multiple switch/pushbutton.

Each of the areas with a conductive ceramic layer includes connection sectors, intended to be connected to a capacitance variation measurement module, configured to measure the capacitance variations that occur in the conductive ceramic layer when an object, hand or finger is moved closer to any of the electrodes that have been deposited. In addition, the capacitance variation measurement module is connected to an electrical system to be switched, such as a light bulb.

The ceramic switch tile further comprises a protective glazing layer (with an adequate coefficient of expansion and low reactivity with the conductive material), which protects the areas with the conductive ceramic layer, deposited on the same face of the non-conductive ceramic support, except the connection sectors, which remain uncovered. These connection sectors, or contact areas, can be on the upper face of the tile, on one side or even on the lower portion. The glazing layer can be decorated, thus being able to customise the tile.

As previously indicated, each area with a conductive ceramic layer is intended to be connected to a capacitance variation measurement module, configured to measure the capacitance variations that occur in the tile when an object, hand or finger is moved closer to any of the electrodes that have been deposited.

Optionally, the ceramic switch tile can comprise an engobe layer, which is a mixture of clay and glazing that is applied to ceramic supports, before firing them, to facilitate the glazing-support coupling, and where appropriate, conceal the colour of the support. The engobe layer can be arranged between the non-conductive ceramic support and the areas with the conductive ceramic layer, or between the areas with the conductive ceramic layer and the glazing layer.

It is also the object of the present invention a method for manufacturing the ceramic switch tile, which comprises a series of steps described below.

A first step consists of forming the non-conductive ceramic support from a mixture of suitable raw materials, and which can be carried out by means of various methods (pressing, extrusion, casting, etc.). Next, the support is cured.

If the tile comes with it, the engobe layer is preferably prepared from inorganic raw materials (clay, frit, etc.) that are wet ground together with rheological additives to obtain a stable suspension.

The areas with conductive ceramic layer are prepared from a solid solution of antimony oxide and tin oxide. The solid solution is prepared by calcination of the oxides. Once synthesised, the solid solution is wet ground to form an aqueous suspension, together with additives. In this case, in addition to rheological additives, others are included to facilitate its sintering during firing.

The glazing layer is prepared from inorganic raw materials (frits, clays, pigments, etc.), which are wet ground together with rheological additives to obtain a stable suspension.

Once the raw non-conductive ceramic support has been prepared, together with the three precursor suspensions of the three layers (engobe layer, conductive ceramic layer and glazing layer), one or more sintering heat treatments are performed each time a layer is deposited, or in all the layers already deposited together, depending on the raw materials used in the support and in each layer.

The deposition of the conductive ceramic layers, engobe layer and glazing layer can be carried out using standard techniques in the ceramic tile industry (cascade application, airbrushing, screen printing, digital injection, etc.), choosing the most appropriate one based on the amount of material to be deposited and the complexity of its distribution on the surface of the non-conductive ceramic support.

DESCRIPTION OF THE DRAWINGS

As a complement to the description provided herein, and for the purpose of helping to make the features of the invention more readily understandable, in accordance with a preferred practical exemplary embodiment thereof, said description is accompanied by a set of drawings constituting an integral part of the same, which by way of illustration and not limitation, the following has been represented.

PREFERRED EMBODIMENT OF THE INVENTION

A preferred embodiment of the ceramic switch tile is described below with the help of FIGS. 1 to 6.

Figure 1:
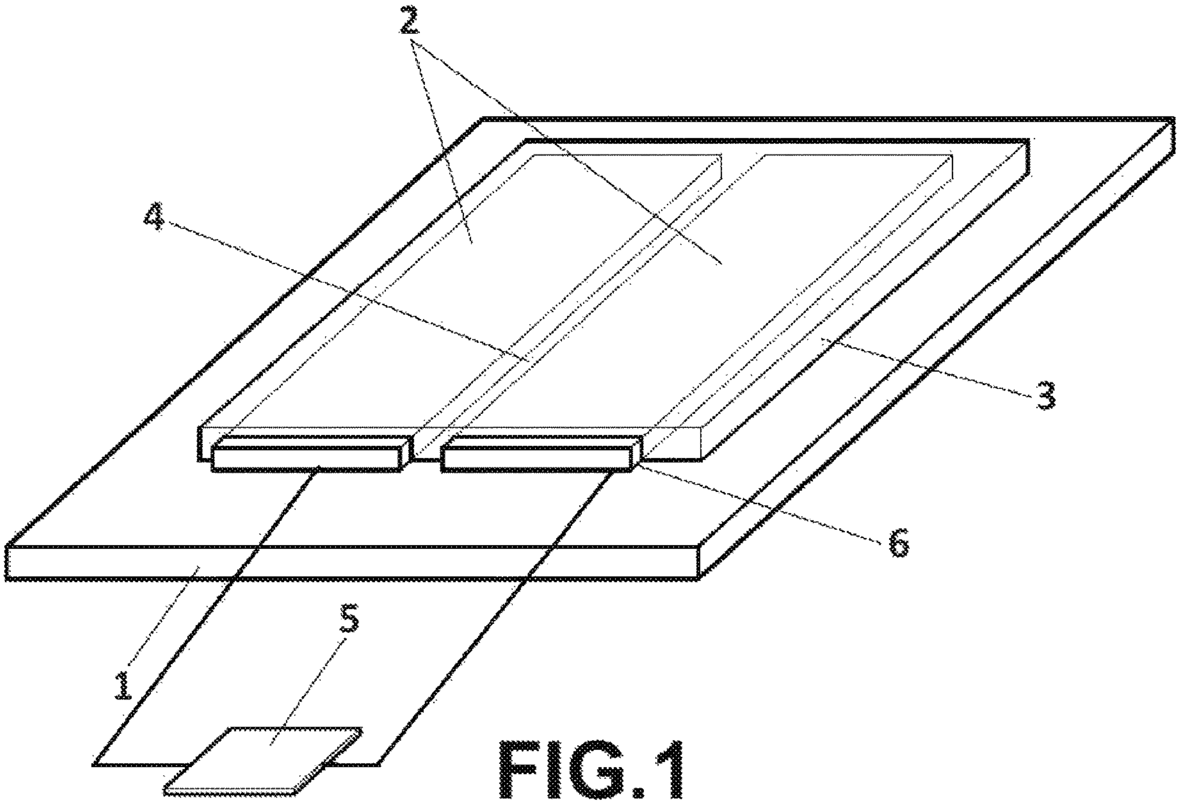
FIG. 1.—Shows a schematic view of the ceramic switch tile connected to the measurement module.

As shown in FIG. 1, the tile comprises a non-conductive ceramic support (1), which can be made of a natural material such as clay, feldspar, kaolin or carbonate, or a synthetic material such as mullite, cordierite or spinel. Preferably, the non-conductive ceramic support (1) will be made from a mixture of natural clays with the addition of feldspars, carbonates or kaolin.

As examples, if a non-conductive ceramic support (1) of the red coating type is to be obtained, it is prepared from a mixture mainly made up of clays rich in iron oxide and calcium carbonate, while if a non-conductive ceramic support (1) of the porcelain stoneware type is to be obtained, a mixture mainly made up of white clays and feldspars is used.

Making contact with the non-conductive ceramic support (1), one or more areas with a conductive ceramic layer (2) are deposited separated from each other, made up of antimony-doped tin oxide, together with sintering additives that allow electrical continuity to be obtained after a sintering treatment.

Specifically, the conductive ceramic layer (2) can be formulated from 14.5 g of a solid solution of tin and antimony oxides (99% $SnO_2$ and 1% $Sb_2O_3$, in molar percentages), 25 g of a commercial aqueous dispersion of antimony tin oxide nanoparticles and 0.5 g of a commercial transparent paving frit. The suspension is applied with a 90 μm opening skid on the non-conductive ceramic support (1) forming a 4×16 cm band in this case. The geometry of the conductive ceramic layer (2) can be adjusted to the requirements of the final design.

In the embodiment shown in FIG. 1, an embodiment is shown with two areas with a conductive ceramic layer (2) making contact with the non-conductive ceramic support (1), separated by a discontinuity (4), so that each area with conductive ceramic layer (2) forms the electrodes of a capacitor.

The discontinuity (4) can have a variable width, for example 0.5 mm wide and can be carried out, either with a cutting tool, separating a single conductive ceramic layer (2), giving rise to two areas of the conductive ceramic layer (2) separated from each other, or by directly depositing the conductive ceramic layer (2) in two parallel areas, separated from each other, by means of the usual techniques of ceramic decoration.

Figure 5:
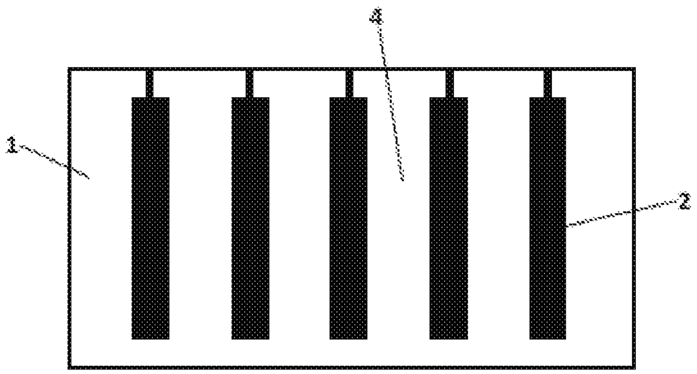
FIG. 5.—Shows an embodiment of the tile as a multiple switch.

As shown in FIG. 5, in one aspect of the invention, the tile can comprise more than two areas with a conductive ceramic layer (2), for using the tile as a multiple switch/pushbutton.

This can be carried out using common techniques in ceramic decoration (airbrushing, screen printing or digital ink injection), the areas with a conductive ceramic layer (2) being deposited in different areas of the non-conductive ceramic support (1), thus creating several switches, which can be independently wired to control different external devices. Thus, switch banks arranged on the same or several tiles can be used, as the object of the invention, for various light sources, or as a bell panel in a building.

Figure 6:
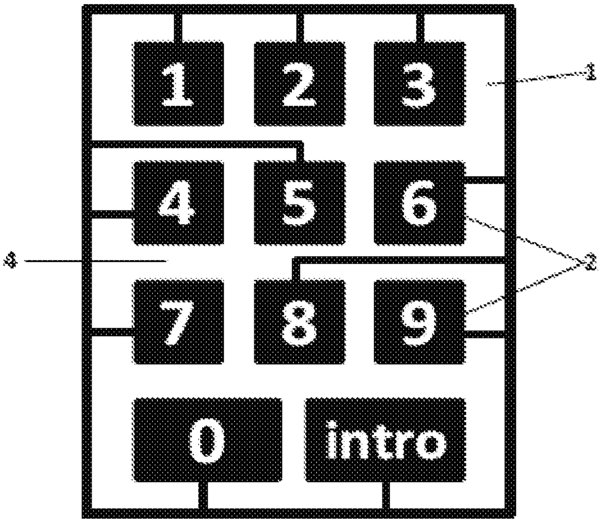
FIG. 6.—Shows an embodiment of the tile as an alphanumeric keyboard.

Furthermore, as shown in FIG. 6, and using digital ink injection technology, the areas with conductive ceramic layer (2) can be arranged to form a ceramic keyboard. Thus, the areas with a conductive ceramic layer (2) are conveniently arranged on the non-conductive ceramic support (1), generating independent circuits for the keyboard.

Each of the areas with a conductive ceramic layer (2) comprises a connection sector (6) intended to be connected to a capacitance measurement system that controls the electrical system to be switched.

Figure 2A:
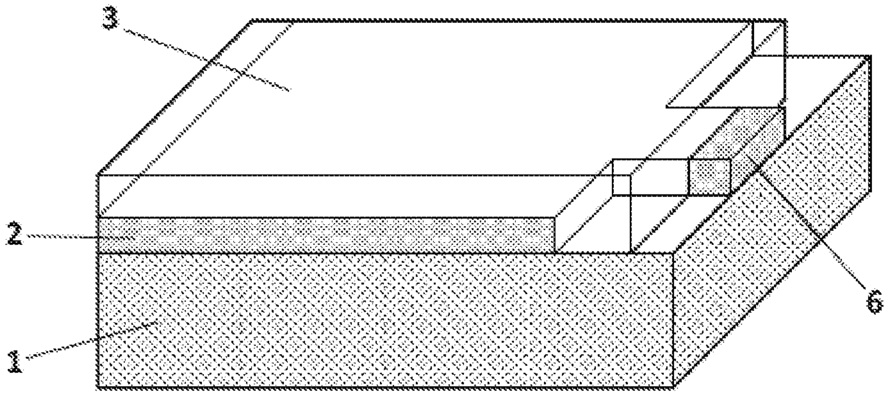
FIGS. 2A and 2B.—Show an embodiment of the tile without an engobe layer.
Figure 2B:
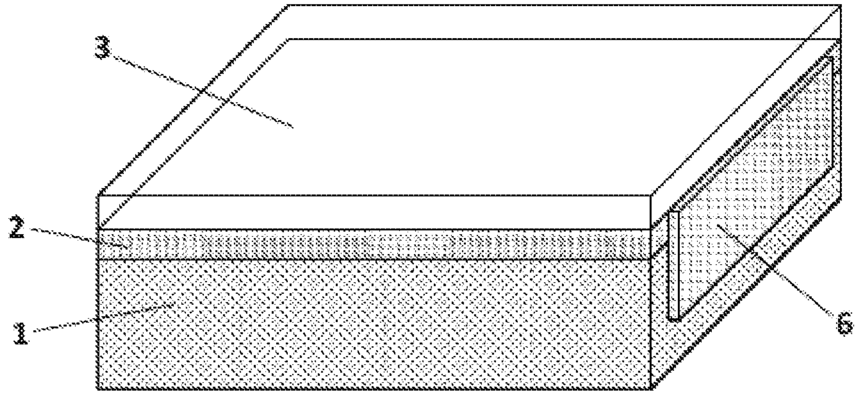
Figure 3A:
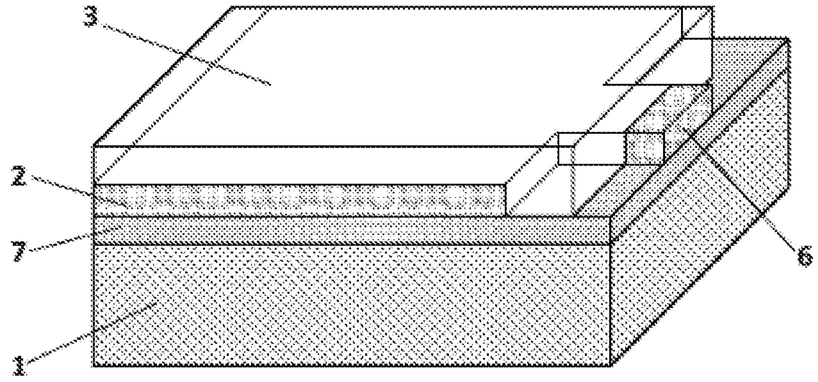
FIGS. 3A and 3B.—Show an embodiment of the tile with an engobe layer between the non-conductive ceramic support and the conductive ceramic layer.
Figure 3B:
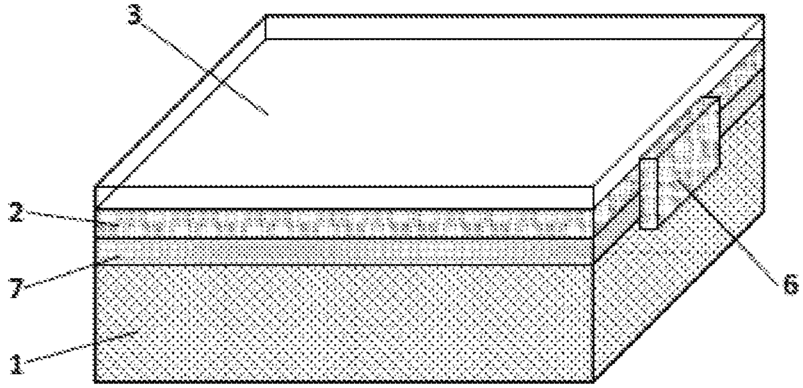
Figure 4A:
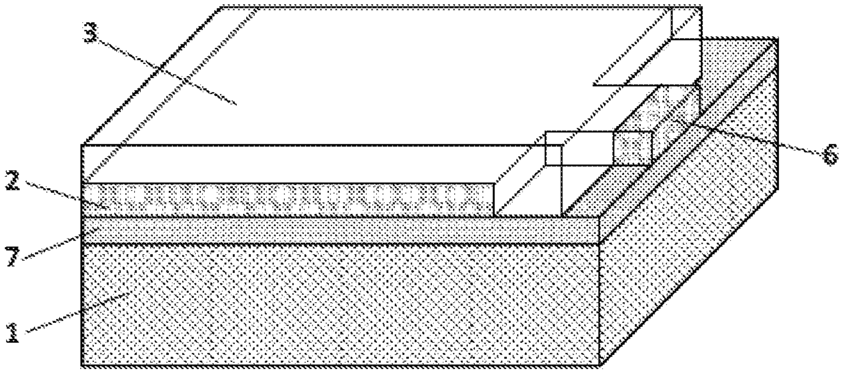
FIGS. 4A and 4B.—Show an embodiment of the tile with an engobe layer between the conductive ceramic layer and the glazing layer.
Figure 4B:
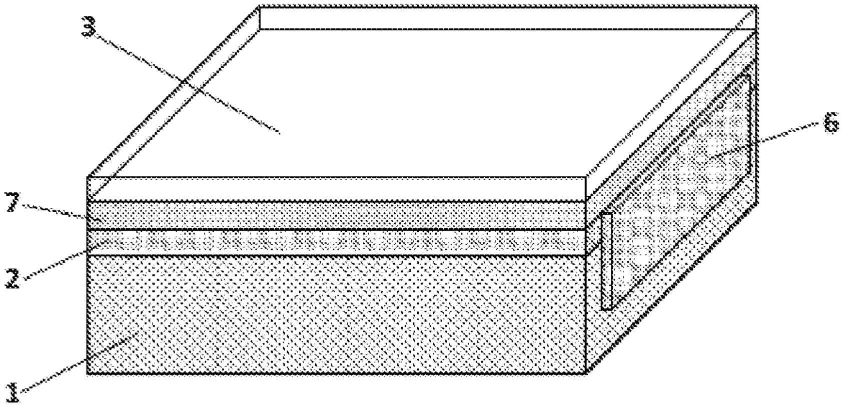

The connection sectors (6) can be arranged on the non-conductive ceramic support (1), as shown in the embodiments of FIGS. 2A, 3A and 4A, or on one side of the non-conductive ceramic support (1), as shown in FIGS. 2B, 3B and 4B.

The tile further comprises a protective glazing layer (3), with an adequate coefficient of expansion and low reactivity with tin oxide, deposited making contact with the areas with the conductive ceramic layer (2), on the same side of the non-conductive ceramic support (1), except for the connection sectors (6), which remain uncovered.

The glazing layer (3) protects the areas having the conductive ceramic layer (2). Numbers, letters and/or symbols can be printed on the glazing layer (3) by depositing a coloured ceramic ink.

The glazing layer (3) can be formulated with different frits depending on the type of finish to be had (glossy, matte, transparent, opaque). In this example, the same transparent frit that was part of the conductive ceramic layer (2) was used, with added percentages of 7% kaolin, 0.3% carboxymethylcellulose as adhesive and 0.3% sodium tripolyphosphate as deflocculant. The suspension is carried out in water with a 70% solids content. The mixture is ground for fifteen minutes in a ball mill at 230 rpm, obtaining a suspension that is applied by spraying on the non-conductive ceramic support (1), after having previously deposited the areas with the conductive ceramic layer (2).

Finally, as shown in FIG. 1, the areas with a conductive ceramic layer (2) are intended to be connected to a capacitance variation measurement module (5), configured to measure capacitance variations that occur in the tile when an object, hand or finger is moved closer to one of the ceramic electrodes formed by the areas with a conductive ceramic layer (2) or to the discontinuity (4) that separates them.

The proposed tile makes it possible to manufacture variable capacitors (ceramic electrodes) in which when the hand or finger is moved closer they modify their capacity, which can be increased between values of 1 $pF \cdot cm^{-2}$ and 200 $pF \cdot cm^{-2}$.

Thus, with the capacitance variation measurement module (5) and once a threshold range has been set for the tripping of the ceramic switch tile, a light can be activated permanently until a new pulse is reached, or the tile can be used in pushbutton mode, so that it is activated only when it is pressed, a very useful aspect when designing more complex devices such as those in FIGS. 5 and 6.

Optionally, the tile can comprise an engobe layer (7). FIGS. 2A and 2B show an embodiment of the tile without this layer. FIGS. 3A and 3B show an embodiment in which the engobe layer (7) is arranged between the non-conductive ceramic support (1) and the conductive ceramic sheets (2). FIGS. 4A and 4B show an alternative embodiment in which the engobe layer (7) is arranged between the conductive ceramic sheets (2) and the glazing layer (3). The conductive ceramic layer (2) could also be located between two engobe layers (7).

It is also the object of the present invention a method for manufacturing the ceramic switch tile, which comprises a series of steps described below.

A first step consists of forming the non-conductive ceramic support (1), and which can be carried out by means of various methods (pressing, extrusion, casting, etc.), but given the predominantly flat geometry of the tile, it will preferably be done by unidirectional dry pressing.

To carry it out, a mixture of selected raw materials is ground to homogenise same and reduce the particle size. Grinding can be carried out by a dry method followed by a granulation step, or a wet method followed by a spraydrying step. By both methods, a powder with sufficient fluidity to feed a press mould can be obtained.

Next, pressing is carried out, at pressures preferably comprised between 100 $kg \cdot cm^{-2}$ and 500 $kg \cdot cm^{-2}$ depending on the nature of the non-conductive ceramic support (1). If it is mostly clayey, the preferred interval is between 250 $kg \cdot cm^{-2}$ and 400 $kg \cdot cm^{-2}$. Once the non-conductive ceramic support (1) has been formed, it is cured.

If included, the engobe layer (7) is preferably prepared from inorganic raw materials, such as white clay and ceramic frits, suitably chosen so that its coefficient of expansion is intermediate between the non-conductive ceramic support (1) and the glazing layer (3). The inorganic raw materials are wet ground together with rheological additives to obtain a stable suspension.

The conductive ceramic sheet(s) (2) are prepared from a solid solution of antimony oxide and tin oxide, in suitable molar proportions (the ratio $Sb_2O_3/SnO_2$ can vary between 0.1/99.9 to 5/95, but preferably between 1/99 and 3/97 would be used).

The solid solution is prepared by calcination of the oxides at temperatures between 600° C. and 1300° C., but preferably between 800° C. and 1100° C., with residence times at maximum temperature between 1 and 8 hours.

Once synthesised, the solid solution is wet ground to form an aqueous suspension, together with additives. In this case, in addition to rheological additives, others are included to facilitate its sintering during firing (preferably a ceramic frit compatible with the glazing layer (3)).

The glazing layer (3) is prepared from inorganic raw materials that are preferably kaolin, ceramic frits, and pigments that give it the final colour. The inorganic raw materials are wet ground together with rheological additives to obtain a stable suspension.

Once the raw non-conductive ceramic support (1) has been prepared, together with the three precursor suspensions of the three layers (engobe layer (7), conductive ceramic layer (2) and glazing layer (3)), various strategies can be adopted to finish the ceramic switch tile.

In a first more complex strategy, the raw non-conductive ceramic support (1) is sintered, and on the sintered non-conductive support (1) the areas with the conductive ceramic layer (2), the engobe layer (7) and the glazing layer (3) (depending on the desired order) are successively deposited, sintering after each application until the final product is obtained.

In a second, simpler strategy, the areas with the conductive ceramic layer (2), the engobe layer (7) and the glazing layer (3) are deposited (depending on the desired order) on the raw non-conductive ceramic support (1), and a single sintering step is performed.

Additionally, intermediate strategies can be designed according to the behaviour of the materials that make up each of the layers (non-conductive ceramic support (1), conductive ceramic layer (2), engobe layer (7) and glazing layer (3)).

The deposition of the conductive ceramic sheets (2), engobe layer (7) and glazing layer (3) can be carried out using standard techniques in the ceramic tile industry (cascade application, airbrushing, screen printing, digital injection, etc.), choosing the most appropriate one based on the amount of material to be deposited and the complexity of its distribution on the surface of the non-conductive ceramic support (1).

The method can comprise a final step of printing letters, numbers and/or symbols on the glazing layer (3), as shown in FIG. 6.

To illustrate the method described, a description of the first strategy is provided below, wherein the non-conductive ceramic support (1) is initially sintered with a firing cycle the maximum temperature of which is chosen based on its nature.

For example, for red tiles it can be sintered between 1050° C. and 1140° C., while for porcelain stoneware it can be sintered between 1160° C. and 1240° C. On the fired non-conductive ceramic support (1), a suspension of the engobe layer (7) is applied, if applicable, and after curing, it is sintered with a cycle similar to that used to sinter the non-conductive ceramic support (1). On the engobe layer (7), or on the non-conductive ceramic support (1), a suspension of the precursors of the conductive ceramic layer (2) is applied, which are sintered at a temperature of about 100° C. below that used in firing the non-conductive ceramic support (1). On the non-conductive ceramic support, including the areas with the conductive ceramic layer (2), the glazing layer (3) is applied, which is sintered at a temperature similar to that used in the sintering of the conductive ceramic layer (2).

The invention claimed is:

1. A ceramic switch tile, comprising:

a non-conductive ceramic support, one or more areas with a conductive ceramic layer, arranged making contact with one face of the non-conductive ceramic support, the one or more areas with a conductive ceramic layer being equipped with a connection sector intended to be connected to a capacitance variation measurement module, configured to control an electrical device to be switched, and a protective glazing layer, arranged covering the one or more areas with the conductive ceramic layer and the non-conductive ceramic support, except for the connection sectors, wherein the non-conductive ceramic support, the conductive ceramic layer, and the protective glazing layer form a sintered multilayer structure, the sintering being produced at a temperature between 1050° C. and 1240° C. and performed either in a single thermal step or in multiple thermal steps following deposition of respective layers.

2. The tile of claim 1, comprising a single area with a conductive ceramic layer.

3. The tile of claim 1, comprising two areas with a conductive ceramic layer.

4. The tile of claim 1, wherein the non-conductive ceramic support is made of a natural material selected from the group consisting of clays, feldspars, kaolin and carbonates.

5. The tile of claim 1, wherein the non-conductive ceramic support is made of a synthetic material selected from the group consisting of mullite, cordierite and spinel.

6. The tile of claim 1, wherein the non-conductive ceramic support is made from a mixture of natural clays and a material selected from the group consisting of feldspars, carbonates and kaolins.

7. The tile of claim 1, wherein the conductive ceramic layer is made of a material selected from the group consisting of antimony-doped tin oxide and zinc oxide doped with aluminum, indium, iron or gallium, together with sintering additives.

8. The tile of claim 1, wherein the protective glazing layer is made of an inorganic material selected from the group consisting of kaolin, ceramic frits and pigments.

9. The tile of claim 1, further comprising an engobe layer positioned between the non-conductive ceramic support and the areas with the conductive ceramic layer.

10. The tile of claim 1, further comprising an engobe layer positioned between the areas with the conductive ceramic layer and the glazing layer.

* * * * *